United States Patent
Higuchi

(10) Patent No.: US 10,558,310 B2
(45) Date of Patent: Feb. 11, 2020

(54) ONBOARD OPERATION APPARATUS

(71) Applicant: DENSO CORPORATION, Kariya, Aichi-pref. (JP)

(72) Inventor: Kazuhiro Higuchi, Kariya (JP)

(73) Assignee: DENSO CORPORATION, Kariya, Aichi-pref. (JP)

( * ) Notice: Subject to any disclaimer, the term of this patent is extended or adjusted under 35 U.S.C. 154(b) by 0 days.

(21) Appl. No.: 16/095,247

(22) PCT Filed: Mar. 30, 2017

(86) PCT No.: PCT/JP2017/013163
§ 371 (c)(1),
(2) Date: Oct. 19, 2018

(87) PCT Pub. No.: WO2017/183408
PCT Pub. Date: Oct. 26, 2017

(65) Prior Publication Data
US 2019/0138126 A1   May 9, 2019

(30) Foreign Application Priority Data
Apr. 22, 2016 (JP) .................. 2016-086272

(51) Int. Cl.
*G06F 3/044* (2006.01)
*G06F 3/01* (2006.01)
(Continued)

(52) U.S. Cl.
CPC .............. *G06F 3/044* (2013.01); *B60K 35/00* (2013.01); *G06F 3/016* (2013.01);
(Continued)

(58) Field of Classification Search
CPC .......... G06F 3/01; G06F 3/041; G06F 3/0488; G06F 3/016; G06F 3/0481;
(Continued)

(56) References Cited

U.S. PATENT DOCUMENTS

| 2010/0169773 A1* | 7/2010 | Yoo ................... G06F 3/016 715/702 |
| 2012/0154316 A1* | 6/2012 | Kono .................. G06F 3/016 345/173 |

(Continued)

FOREIGN PATENT DOCUMENTS

| JP | 2013073426 A | 4/2013 |
| JP | 2014052787 A | 3/2014 |

*Primary Examiner* — Nitin Patel
*Assistant Examiner* — Amen Woldesenbet Bogale
(74) *Attorney, Agent, or Firm* — Harness, Dickey & Pierce, P.L.C.

(57) ABSTRACT

An onboard operation apparatus includes an operation panel having an operation face touch-operated on by a fingertip of a user, an output part outputting an operation signal that corresponds to an operation element touch-operated, a vibration instrument causing the user to feel vibration, a position sensor detecting the touch position by a fingertip, and a vibration control part controlling the actuation of the vibration instrument. The onboard operation apparatus further includes a trace calculation part calculating the movement trace of a touch position, and a prediction part predicting whether the touch position reaches a second operation element within a predetermined time. The vibration control part has an entering vibration control part and a holding control part.

4 Claims, 7 Drawing Sheets

(51) Int. Cl.
  *H03K 17/96* (2006.01)
  *B60K 35/00* (2006.01)
  *G06F 3/0354* (2013.01)

(52) U.S. Cl.
  CPC ....... *G06F 3/03547* (2013.01); *H03K 17/962* (2013.01); *B60K 2350/1036* (2013.01); *B60K 2370/1446* (2019.05)

(58) Field of Classification Search
  CPC .... G06F 3/04812; G06F 3/018; G06F 3/0233; G06F 3/017; G06F 3/04817; G06F 3/04842; G06F 3/04808; G06F 3/0412; G06F 3/0416; G06F 3/03547; G06F 3/04886; G06F 3/04883; G06F 2203/014; B60K 2370/10; B60K 2370/11; B60K 2370/141; B60K 2370/143; B60K 2370/1434; B60K 2370/1438; B60K 2370/145; B60K 2370/146; B60K 2370/1468; B60K 2370/1442; B60K 2370/186; B60K 2370/1876; B60K 2370/18; B60K 2370/182; B60K 2370/191; B60K 2370/197; B60K 2370/199; B60K 2370/111; B60K 2370/113; B60K 2370/115; B60K 2370/117; B60K 2370/119; B60K 2370/1464; B60K 2370/1472; B60K 2370/1476; G01C 21/36; G01C 21/3617; G01C 21/3664

See application file for complete search history.

(56) References Cited

U.S. PATENT DOCUMENTS

2013/0215021 A1\* 8/2013 Morikawa ............... G06F 3/041
    345/157
  2017/0277498 A1\* 9/2017 Wood, Jr. ............. G06F 3/1423

\* cited by examiner

| | SITUATION | ASPECT OF VIBRATION CONTROL |
|---|---|---|
| EXAMPLE 1 | SLOW QUICK (NEAR) |  |
| EXAMPLE 2 | SLOW QUICK (DEVIATION) |  |
| EXAMPLE 3 | SLOW (FAR) |  |
| EXAMPLE 4 | QUICK (FAR) |  |

ONBOARD OPERATION APPARATUS

CROSS-REFERENCE TO RELATED APPLICATIONS

This application is a U.S. National Phase Application under 35 U.S.C. 371 of International Application No. PCT/JP2017/013163 filed on Mar. 30, 2017. This application is based on and claims the benefit of priority from Japanese Patent Application No. 2016-086272 filed on Apr. 22, 2016. The entire disclosures of all of the above applications are incorporated herein by reference.

TECHNICAL FIELD

The present disclosure relates to an onboard operation apparatus installed in a vehicle and touch-operated by a fingertip of a user.

BACKGROUND ART

An operation apparatus described in Patent Literature 1 has an operation panel having an operation face touch-operated by a fingertip of a user and a vibration instrument applying vibration to the user by vibrating the operation panel. Multiple operation elements (for example, Japanese syllabary including 50 sounds) are displayed in the operation face, and an operation signal corresponding to the touch-operated operation element is outputted. For example, while the fingertip touches the operation face, when an operation (tracing operation) moving the fingertip from a first operation element to a second operation element is performed, an operation signal corresponding to the first operation element is output. And then, an operation signal corresponding to the second operation element is output.

PRIOR ART LITERATURE

Patent Literature

Patent Literature 1: JP 2014-52787 A

SUMMARY OF INVENTION

It is supposed that the user performs a blind operation without seeing the operation face since this kind of an operation apparatus is mounted on a vehicle. It is required to apply vibration corresponding to the touch-operation to the user. The apparatus described above informs the user by vibrating the vibration instrument that a desired operation signal is normally outputted. That is, in a case where the tracing operation described above is performed, the user may be possible to recognize that the fingertip exits from the first operation element through vibration (exiting vibration) at when the touch position moves from the inside to the outside of the first operation element. After that, the user may be possible to recognize that the fingertip enters the second operation element through vibration at when the touch position moves from the outside to the inside of the second element (entering vibration).

According to the method of the vibration described above, the entering vibration is performed immediately after the exiting vibration at when the fingertip quickly moves and the tracing operation is performed. In the case, the user is difficult to discriminate the exiting vibration and the entering vibration or the user recognizes the exiting vibration and the entering vibration as successive different signals since the exiting vibration and the entering vibration is successively performed without an interval. That is, the user may become difficult to recognize notification content by the vibration.

By contrast, Patent Literature 1 describes a vibration control forbidding the entering vibration until a predetermined time lapses after the exiting vibration is performed. According to the vibration control, when the tracing operation is performed with a quick movement performed so that a time from the exiting time to the entering time is less than the predetermined time, the entering vibration after the exiting vibration is prohibited. The above difficulty is solved However, in the vibration control described above, the tracing operation is performed with the fingertip quickly moving, so that the exiting vibration occurs and the entering vibration does not occur. Therefore, the user is difficult to recognize whether the fingertip can enter the second operation element since the entering vibration does not occur by quickly moving the fingertip in both cases where the fingertip can enter the second operation element desired by the user and where the fingertip cannot enter the second operation element desired by the user.

A user who is used to performing the blind operation in a state where the positional relationship between the operation element and the fingertip is roughly understood tends to quickly move the fingertip performing the tracing operation. Therefore, a user, who is used to performing the blind operation, concerns about whether the user can enter the second operation element, greater than a concern about whether the user can leave the first operation element. Therefore, the entering vibration is more useful than the exiting vibration for the user who is used to quickly moving the fingertip. Thereby, the control vibration without occurrence of the entering vibration is difficult to sufficiently satisfy expectations of the user, and usability is low.

It is an object of the present disclosure to provide an onboard operation apparatus causing a user to easily recognize notification content by vibration and also having a high usability for the user moving the fingertip quickly.

According to one aspect of the present disclosure, an onboard operation apparatus includes: an operation panel that is installed in a vehicle and has an operation face that is touch-operated by a fingertip of a user; an output part that outputs an operation signal corresponding to an operation element that is touch-operated, the operation element being one of multiple operation elements arranged on the operation face; a vibration instrument that vibrates the operation panel, causing the user performing a touch operation to feel vibration; a position sensor that detects a touch position by the fingertip on the operation face; a vibration control part that controls actuation of the vibration instrument corresponding to the touch position detected by the position sensor; a trace calculation part that calculates a movement trace of the touch position based on a detection history by the position sensor; and a prediction part that predicts based on the movement trace inside a first operation element of the multiple operation elements, whether the touch position reaches a second operation element of the multiple operation elements within a predetermined time, when the touch position moves from inside of the first operation element to outside of the first operation element. The vibration control part has an entering vibration control part that actuates the vibration instrument regardless of a prediction result by the prediction part at when the touch position moves from outside of the second operation element to inside of the second operation element, and the vibration control part also has a holding control part that holds the actuation of the vibration instrument and causes the vibration instrument not to vibrate at when the touch position moves from the inside of the first operation element to the outside of the first operation element in a case where the prediction by the prediction part affirms a reaching.

According to the present disclosure, since the holding control part is included, actuation of the vibration instrument (hereinafter, referred to as an exiting vibration) is held when entering to the second operation element within the predetermined time is predicted at when the touch position exits the first operation element. In a case where the tracing operation is performed from the first operation element to the second operation element, the entering to the second operation within the predetermined time is predicted and the exiting vibration is held when the user moves the fingertip quickly. The exiting vibration notifying the exiting from the first operation element and the entering vibration notifying the entering to the second operation element are avoided to be successively performed without an interval. Therefore, it may be possible to reduce that the user is difficult to recognize the notification content provided by the vibration.

Furthermore, according to the embodiment, the entering vibration is performed regardless of the prediction result by the prediction part at when the touch position enters the second operation element since the entering vibration control part is included. Not only when the speed of the fingertip entering the second operation element is slow but also when the speed of the fingertip entering the second operation element is quick, the entering vibration is performed. As described above, it may be possible to improve the usability for the user moving the fingertip quickly since the entering vibration is more useful than the exiting vibration for the user being used to moving the fingertip quickly.

BRIEF DESCRIPTION OF DRAWINGS

The above and other aspects, features and advantages of the present disclosure will become more apparent from the following detailed description made with reference to the accompanying drawings. In the drawings.

DESCRIPTION OF EMBODIMENTS

Multiple embodiments of the present disclosure will be explained in reference to the drawings. In each of the embodiments, a component including identical or similar function each other will be omitted by attaching identical numerals as needed. In each of the embodiments, when only a part of the configuration is explained, the other part of the embodiment can be referred to the other embodiment explained previously and applied.

First Embodiment

Figure 1:
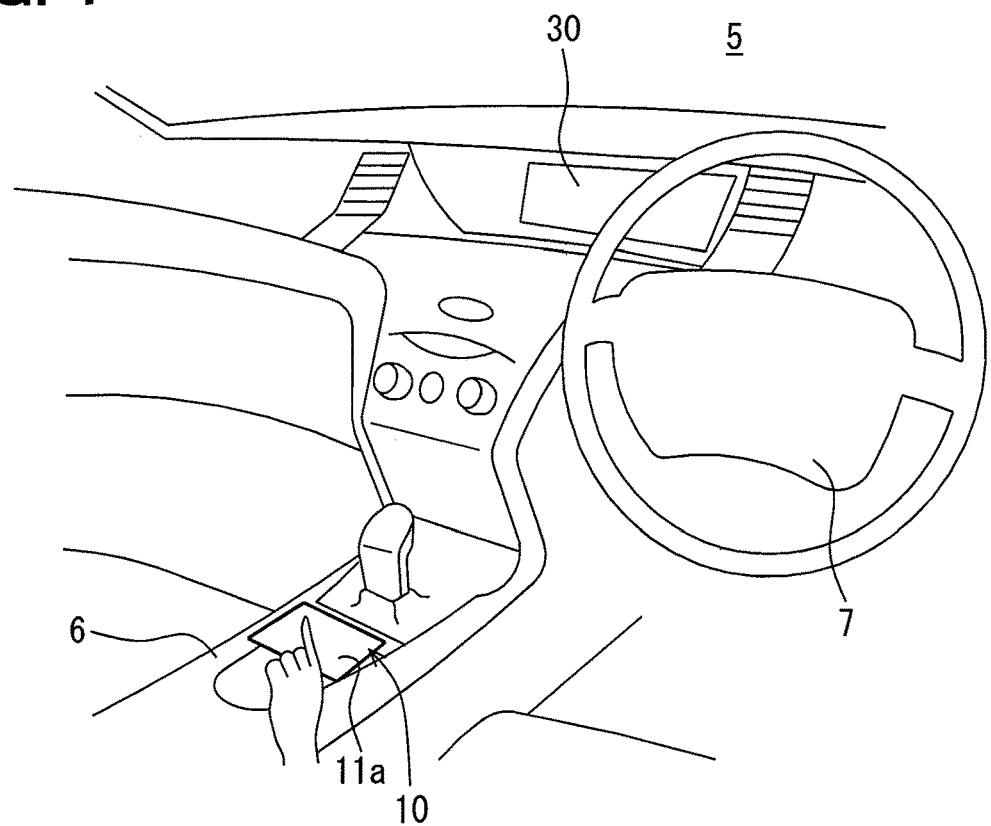
FIG. 1 is a view illustrating an arrangement layout of a vehicle interior of an onboard operation apparatus according to a first embodiment of the present disclosure.
Figure 2:
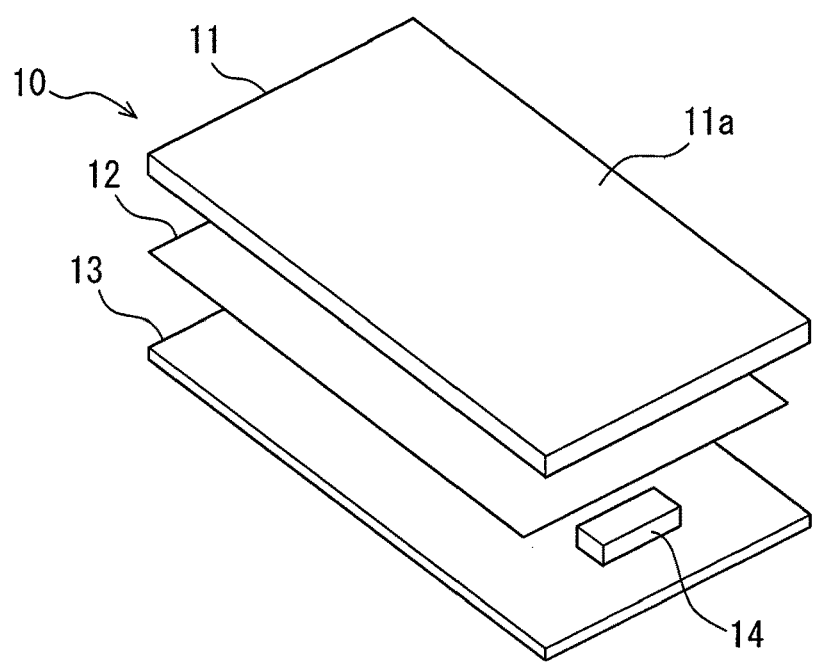
FIG. 2 is an exploded perspective view of the onboard operation apparatus.
Figure 3:
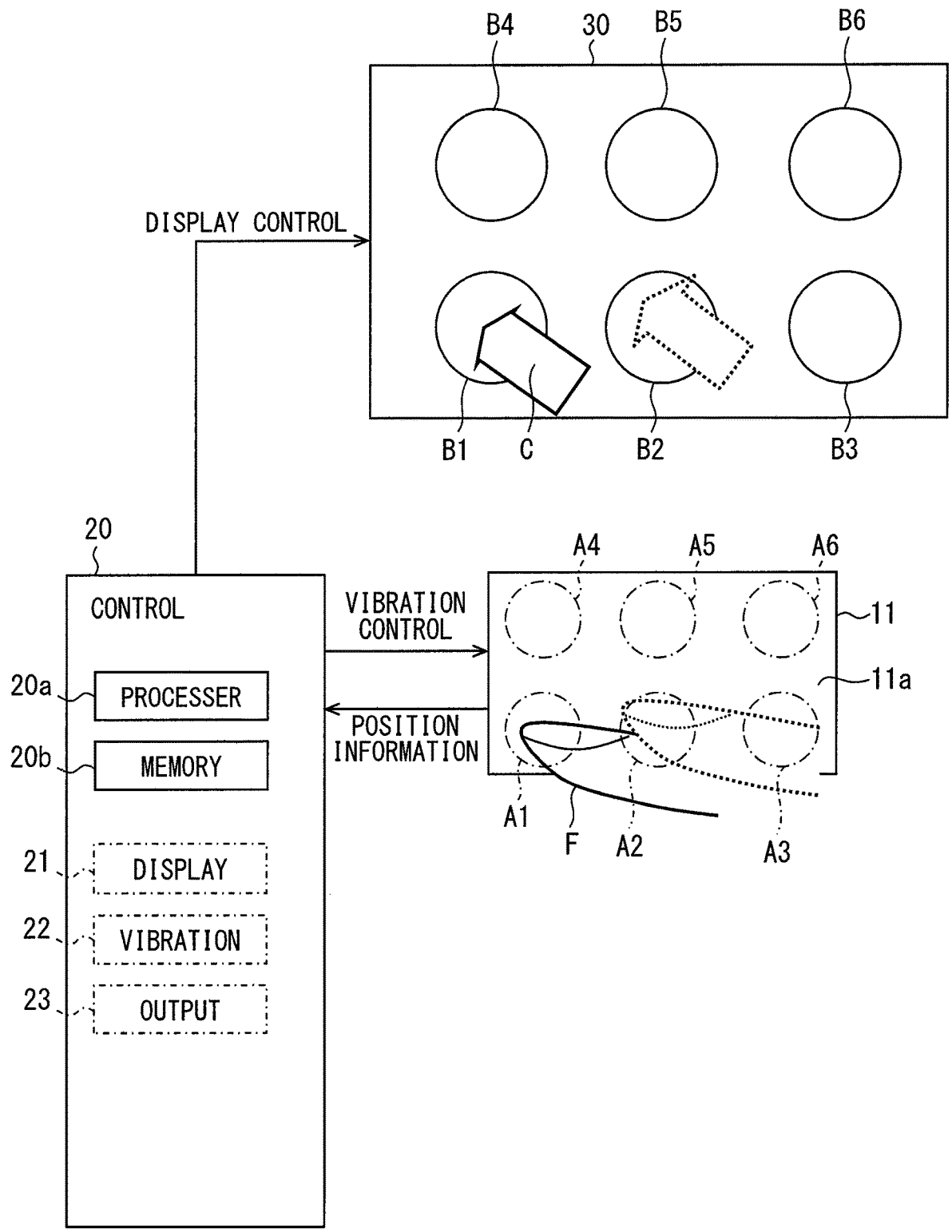
FIG. 3 is an electric block diagram of the onboard operation apparatus according to the first embodiment.

The onboard operation apparatus according to the embodiment includes an input device 10 shown in FIG. 1 to FIG. 3 and a control device 20 shown in FIG. 3. The input device 10 and the control device 20 are installed in a vehicle.

As shown in FIG. 1, the input device 10 is installed within a range that the hand of a vehicle driver (a user) can reach in the interior of the vehicle. The operation content by the input device 10 is displayed on a display device 30. The display device 30 is installed in a peripheral of a front windshield 5. The input device 10 is installed in a center console 6 located between a driver's seat and a passenger's seat. That is, the input device 10 and the display device 30 are separately placed. The display device 30 is placed above the input device 10.

It may be possible to view the display device 30 without largely moving a visual line at the time of driving. It may be possible to operate the input device 10 positioned at hand without changing a posture of the driving user, by placing the input device 10 and the display device 30 in different positions.

The input device 10 operates the operation contents of various instruments installed in the vehicle. Specific examples of instrument include a navigation instrument, an audio instrument, an air conditioner or the like. The display device 30 displays operation contents of various instruments in addition to the operation contents of the above described various devices.

As shown in FIG. 2, the input device 10 includes an operation panel 11, a detection sheet 12, and a circuit board 13. The operation panel 11 is a plate shape panel having an operation face 11a that is touch-operated by a user's fingertip F. The input device 10 is attached to the center console 6 so that the operation face 11a is exposed to the vehicle interior.

The circuit board 13 is placed on a side opposite to the vehicle interior with respect to the operation panel 11. The detection sheet 12 is placed between the circuit board 13 and the operation panel 11. The operation panel 11, the detection sheet 12 and the circuit board 13 are housed and retained in a housing (not shown) in a state that the detection sheet 12 is placed with facing the operation panel 11 and the circuit board 13. The detection sheet 12 is stuck to the operation panel 11 with adhesive.

The detection sheet 12 is placed in the opposite side of the operation face 11a to the operation panel 11. The detection sheet 12 has a structure retaining multiple electrodes (not shown) in an insulation sheet. The electrodes form an electrostatic capacitance between the operation face 11a and the fingertip F, which touch operates the operation face 11a. The electrodes output a detection signal corresponding to the electrostatic capacitance. For example, the detection sheet 12 of a matrix type in which the multiple electrodes are arranged with longitudinally and transversely crossing as a grid shape is used, for example.

The circuit board 13 detects the touch position by the fingertip F on the operation face 11a based on a detection signal outputted from the electrodes. The circuit board 13 transmits information (position information) on the detected touch position to the control device 20. The detection of the touch position and the transmission of the position information are repeatedly performed in a predetermined cycle (for example, 10 milliseconds). For example, when the detection signal outputted from the electrode exceeds a predetermined threshold value, it is determined as presence of touch operation. It is determined that a grid point of the multiple grid points at a portion exceeding the threshold value is the touch position. It is determined that the tracing operation in which the fingertip F is moved with touching the operation face 11a is performed, when the position of the grid point exceeding the threshold value moves successively.

A vibration instrument 14 is electrically connected with the circuit board 13. The vibration instrument 14 contacts with the operation panel 11 in a state that the operation panel 11, the detection sheet 12 and the circuit board 13 are combined. For example, the vibration instrument 14 includes an electric motor and a vibrator. When the electric motor is driven to rotate by energization from the circuit board 13, the vibrator attached to a rotating shaft of the electric motor rotates and vibration is generated. Hence, a vibration pattern by the vibrator is changed by changing duration of the energization or the on-off pattern of the energization. The user who performs a touch operation to the operation face 11a feels the vibration generated by the vibration instrument 14 since the vibration instrument 14 contacts with the operation panel 11.

As shown in FIG. 3, the control device 20 has a processor 20a and a memory 20b. The processor 20a executes various kinds of control by executing the operation process to a program stored in the memory 20b. The processor 20a controls the display content of the display device 30 (display control) based on information showing a vehicle state such as a vehicle speed, a vehicle traveling position, a remaining fuel amount, or based on position information acquired from the input device 10, for example.

Further, the processor 20a controls (vibration control) the actuation of the vibration instrument 14 based on the position information acquired from the input device 10 and display control contents. The processor 20a at the time of performing the vibration control corresponds to a vibration control part 22.

An operation signal is outputted to various kinds the onboard instrument installed in the vehicle (output control) based on the position information acquired from the input device 10 or the display control content. As specific example of the onboard instrument, the air conditioner that performs air conditioning the interior of the vehicle, the navigation device that navigates a traveling route of the vehicle, the audio device or the like is given. The processor 20a at the time of performing the output control corresponds to an output part 23.

The display device 30 can be switched to various display modes, such as a mode for displaying the traveling route of the vehicle, a mode for displaying operation contents of the audio device, a mode for displaying the air conditioning state, or the like. In a mode exemplified in FIG. 3, a cursor C and multiple icon buttons B1, B2, B3, B4, B5, B6 are displayed. The cursor C is displayed at a position in the display area of the display device 30, a position corresponding to the position information output from the input device 10. The user performs the tracing operation so that the cursor C is positioned on the desired icon button B2. After that, the user releases the fingertip F from the operation face 11a at a cursor position, and a command allocated to the icon button B2 is outputted. As the specific example of the command, a command starting the various kinds of the onboard instrument described above is given.

In an operation area of the operation face 11a, areas corresponding to each of the icon buttons B1, B2, B3, B4, B5, and B6 are set as operation elements A1, A2, A3, A4, A5, A6. For example, as shown by a solid line in FIG. 3, the fingertip F touches a portion of the operation element A1 of the operation face 11a, and the cursor C is displayed at the position of the icon button B1 corresponding to the operation element A1. After that, as shown by a dotted line of FIG. 3, the tracing operation with the fingertip F is performed from the operation element A1 to the operation element A2, and a display position of the cursor C is moved from the icon button B1 to the icon button B2.

Figure 4:
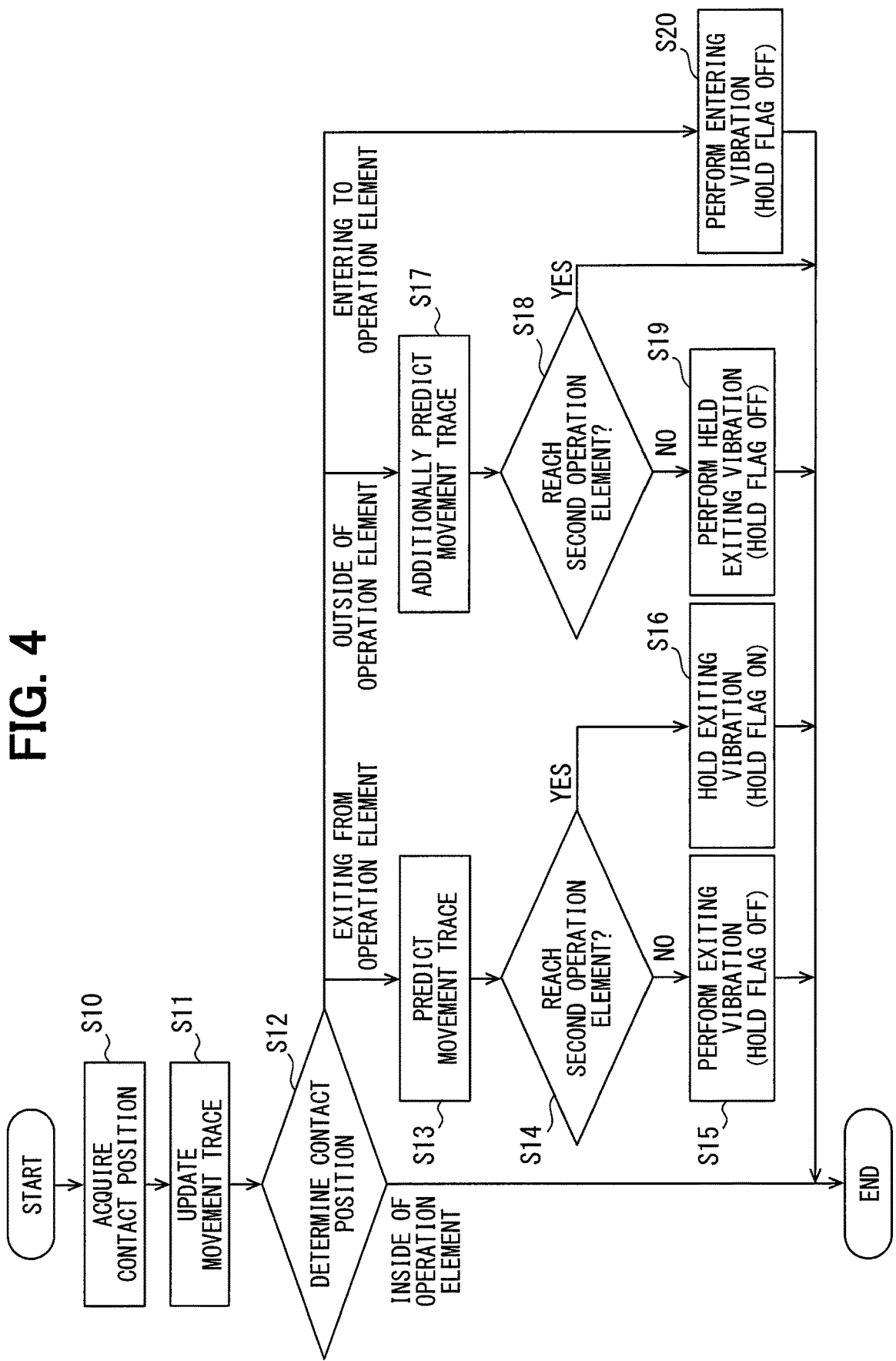
FIG. 4 is a flowchart showing a process procedure of a processor functioning as a vibration control part.

FIG. 4 is a flowchart showing the process procedure of the processor 20a functioning as the vibration control part 22. The process is repeatedly executed in a predetermined cycle such as a calculation cycle of the processor 20a, while a power source of the input device 10, the control device 20 and the display device 30 turn on.

First, in S10 of FIG. 4, the position information transmitted from the input device 10, that is, the information on the touch position by the fingertip F touch operating is acquired. In the following S11, the movement trace of the touch position acquired in S10 is calculated. When the touch operation continues, the movement trace calculated present time is added to the previously calculated movement trace, and the movement trace is updated. The processor 20a at the time of executing the processing in S11 corresponds to a trace calculation part calculating the movement trace of the touch position based on the detection history of the position sensor.

In S12, a correspondence relation between areas of the operation face 11a set as operation elements A1 to A6 and the touch position acquired in S10 is determined. In S12, the touch position to an operation element is determined. Specifically, it is determined based on the touch position acquired in S10 and the movement trace calculated in S11, that any of correspondence relations is applied, the correspondence relation being "Inside of operation element", "Exiting from operation element", "Outside of operation element", or "Entering to operation element" explained as bellow.

"Inside of operation element" represents a correspondence relation that the touch position exists inside the multiple operation elements A1 to A6, in the other words, inside a circle area surrounded by the dashed line of FIG. 3. "Outside of operation element" represents a correspondence relation that the touch position exists outside the multiple operation elements A1 to A6, in the other words, outside the circle area surrounded by the dashed line of FIG. 3. "Exiting from operation element" represents a correspondence relation that though the touch position at a previous acquisition is "Inside of operation element", the touch position at a present acquisition is changed to "Outside of the operation element". "Entering to operation element" represents a correspondence relation that though the touch position at the previous acquisition is "Outside of operation element", the touch position at the present acquisition is changed to "Inside of operation element".

Hence, for example, the tracing operation is performed from a solid line position to the dotted line position of FIG. 3, in the other words, from the operation element A1 to the operation element A2, so that it is determined as "Inside of operation element A1" while the touch position is in the operation element A1. It is determined as "Exiting from operation element A1" at the time of exiting from the operation element A1, it is determined as "Outside of operation element" until reaching the operation element A2, and thereafter it is determined as "Entering to operation element A2" at the time of entering the operation element A2.

When it is determined as "Inside of operation element" in S12, the process of FIG. 4 ends without actuating the vibration instrument 14.

When it is determined as "Exiting from operation element" in S12, a future movement trace is predicted based on the history of the touch position until the present time in S13. Specifically, the movement trace after the present time is predicted based on the movement trace until the present time and also the touch position at when the predetermined time lapses from the present time is predicted based on the movement speed of the touch position until the present time.

Figure 5:
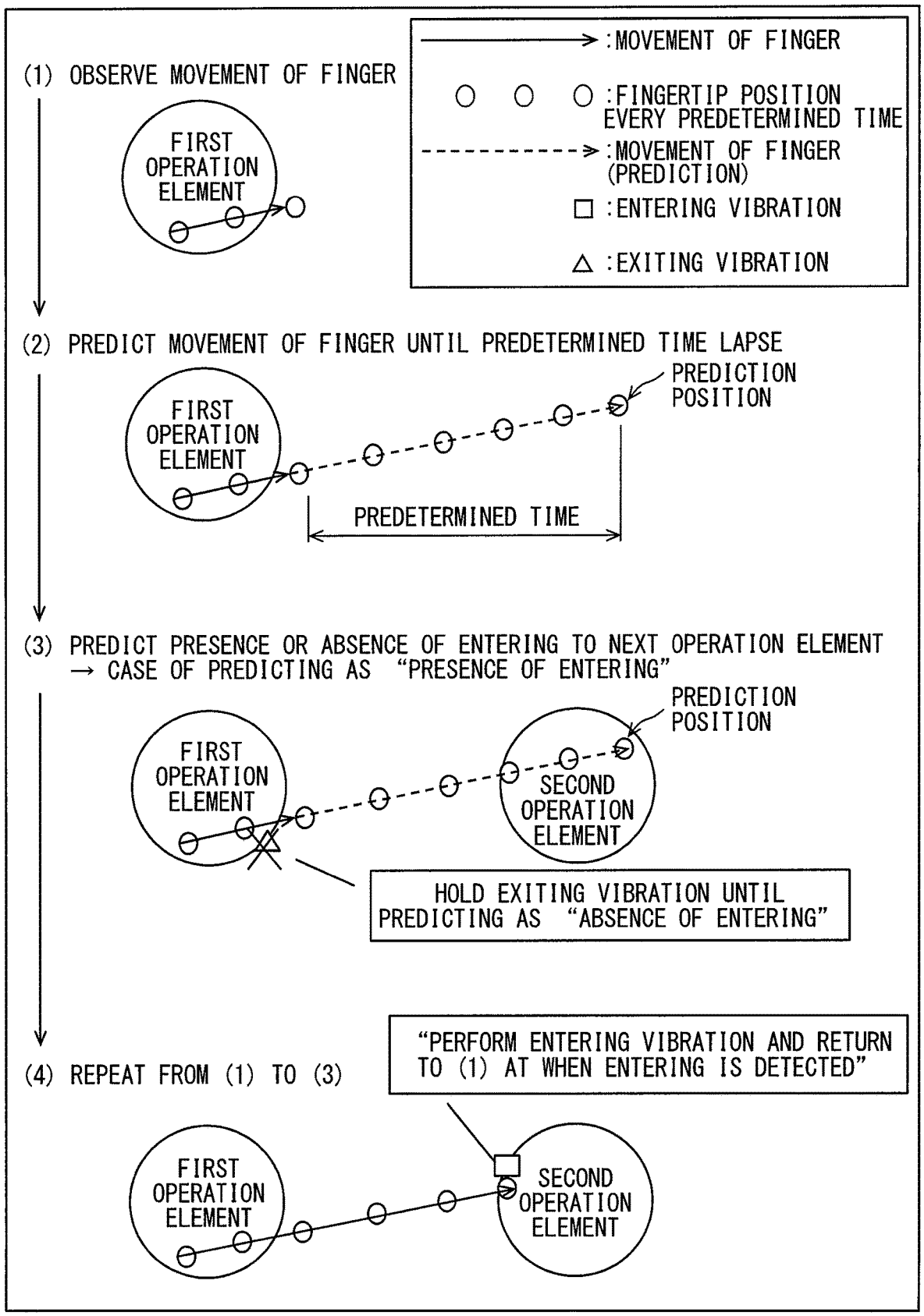
FIG. 5 is an explanatory view showing one example of the embodiments of an exiting vibration and an entering vibration when a prediction result affirms reaching in the flowchart of FIG. 4.
Figure 6:
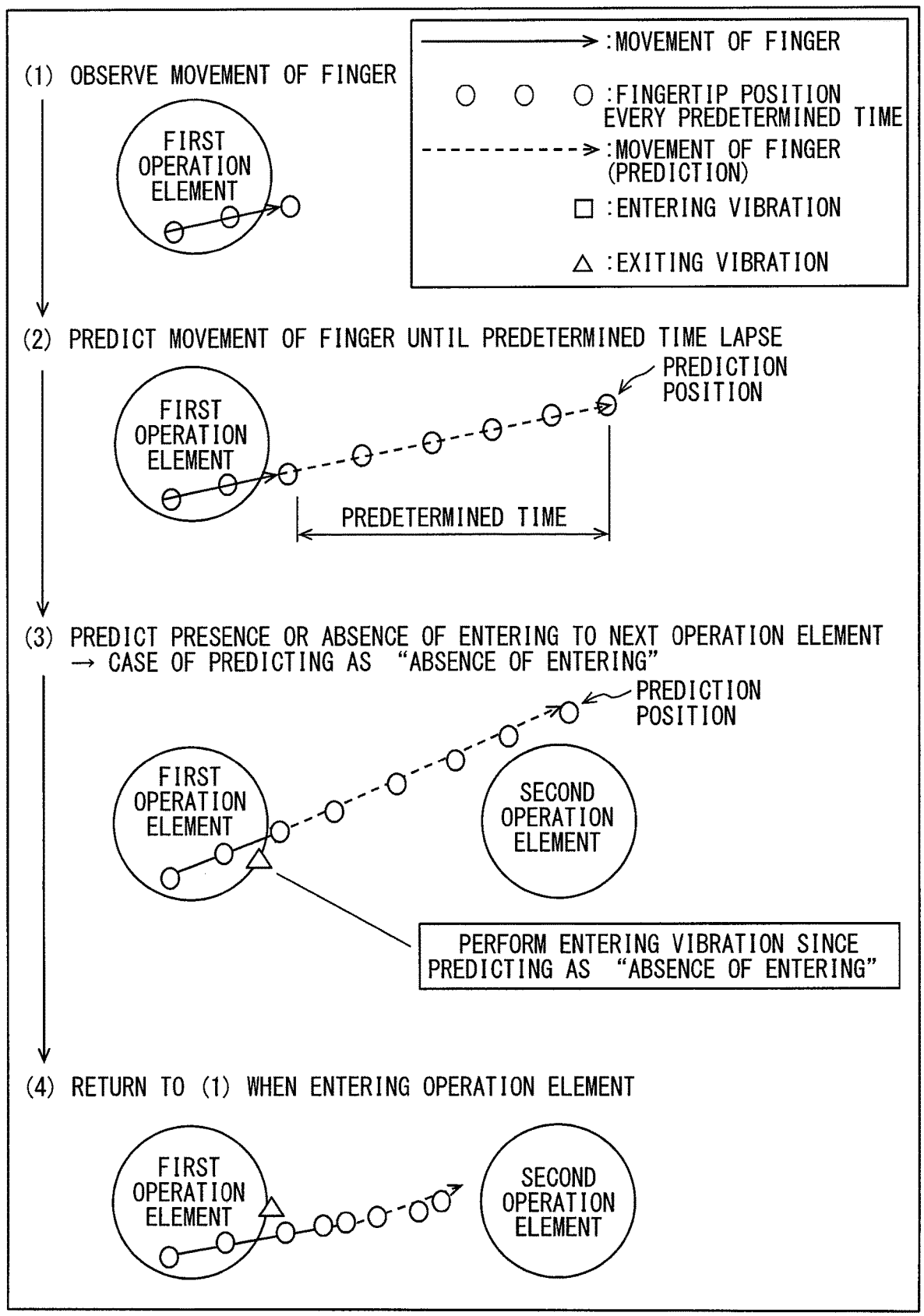
FIG. 6 is an explanatory view showing one example of the embodiments of an exiting vibration and an entering vibration when a prediction result denies reaching in the flowchart of FIG. 4.

For example, movement traces shown by the solid line in a situation (1) of FIG. 5 and a situation (1) of FIG. 6 are movement traces inside the operation element A1 (first operation element) determined as the inside of the operation element at the previous process. Movement traces shown by dotted lines in a situation (2) of FIG. 5 and a situation (2) of FIG. 6 are predicted based on the movement traces. In FIG. 5 and FIG. 6, a circle sign shows a position of the fingertip every predetermined time, a square sign shows the entering vibration, and a triangle sign shows the exiting vibration. A solid arrow shows the movement of the finger and a dotted arrow shows the predicted movement of the finger. In regard to the movement trace inside the operation element A1, an average process is executed to the touch position that is acquired every predetermined time, and linearization is provided. An extended line of the linearized line is calculated as a prediction movement trace. The movement speed inside the operation element A1 is calculated based on the touch position, the touch position being acquired inside the operation element A1 every predetermined time. The position on the prediction movement trace at when the predetermined time lapses at the movement speed is set to the prediction position after the predetermined time.

In S14, it is predicted whether the touch position reaches the operation element within the predetermined time from the present time, based on the relation among the movement trace and the prediction position predicted in S13 and the multiple operation elements A1 to A6 set on the operation face 11a. The processor 20a at the time of executing the processes in S13, S14 corresponds to a prediction part predicting whether the touch position reaches any operation element (a second operation element) within the predetermined time based on the movement trace inside the first operation element.

For example, as shown in a situation (3) of FIG. 5, when any of the operation elements A1 to A6 (the second operation element) exists on the prediction movement trace reaching the prediction position, a prediction result is provided. The prediction result affirms the reaching that the touch position reaches the operation element within the predetermined time. By contrast, as shown in the situation (3) of FIG. 6, when the second operation element does not exist on the prediction movement trace of reaching the prediction position, a prediction result is provided, the prediction result denying the reaching that the touch position does not reach to the operation element within the predetermined time.

When it is determined in S14 as a negative determination not to reach, the vibration instrument 14 is actuated in S15, and a hold flag is set to off. Thereby, the vibration at the time of exiting the first operation element (exiting vibration) is performed. The user recognizes that the fingertip F exits the first operation element. The processor 20a at the time of executing the process in S15 corresponds to an exiting vibration control part, the entering vibration control part performing the exiting vibration in the case where the prediction result denies the reaching.

When an affirmation determination of reaching is performed in S14, the actuation of the vibration instrument 14 to notify the exiting from the first operation element in S16 (exiting vibration) is held. The hold flag is set to turn on. The processor 20a at the time of executing the process in S16 corresponds to a hold control part, the hold control part holing the exiting vibration without performing the exiting vibration in the case where the prediction result affirms the reaching.

When it is determined as "Outside of operation element" in S12, the future movement trace is predicted based on the history of the touch position until the present time in S17. In S17, the movement trace of the touch position is additionally predicted. Specifically, similarly to S13, the movement trace after the present time is predicted based on the movement trace until the present time. In addition, the touch position at when the predetermined time lapses from an exiting time from the first operation element is predicted based on the movement speed of the touch position until the present time. That is, in addition to the prediction result at the exiting time in S13, the prediction is performed also while it is determined as "Outside of the operation" after the exiting time.

In S18, it is predicted whether the touch position reaches the operation element within the predetermined time from the exiting time based on the relation among the additionally predicted movement trace in S17, the prediction position in S17, and the positions of the operation elements A1 to A6 set on the operation face 11a. The processor 20a at the time of executing the processes in S17 and S18 corresponds to an additional prediction part. The additional prediction part additionally predicts whether the touch position reaches the any of the operation elements (a second operation element) within the predetermined time from the exiting time, based on the movement trace from the exiting time to the present time.

When the negative determination of not reaching is performed in S18, the held exiting vibration is performed by actuating the vibration instrument 14, and the hold flag is set to be off in S19. Thereby, the vibration is performed slightly later than the exiting time from the first operation element. The user recognizes that the fingertip F exits the first operation element. The exiting vibration in S19 is performed in a condition that the hold flag turns on. The processor 20a executing the process in S19 corresponds to a hold release part. The hold release part releases the hold of the exiting vibration and performs the exiting vibration when the additional prediction result denies the reaching.

When the affirmation determination affirming the reaching is performed in S18, a state of the hold flag is maintained without actuating the vibration instrument 14, and the process of FIG. 4 ends.

When it is determined as "Entering to operation element" in S12, the vibration instrument 14 is actuated in S20. Thereby, the vibration is performed at entering time to the second operation element (entering vibration), and the user recognizes that the fingertip F enters the second operation element. In S20, the hold flag turns off when turns on, and the hold flag continues to turn off when turns off. The processor 20a at the time of executing the process in S20 corresponds to an entering vibration control part. The entering vibration control part actuates the vibration instrument 14 regardless of the prediction result by the prediction part.

FIG. 5 is one example in a case where the prediction result affirming the reaching is performed in S14 and also in a case where the additional prediction result affirming the reaching is performed in S18 after S14. In the example, the entering vibration is performed without performing the exiting vibration since the second operation element is entered as shown in a situation (4) of FIG. 5 with keeping to hold the exiting vibration as shown in the situation (3) of FIG. 5.

FIG. 6 is one example in a case where the prediction result denying the reaching is performed in S14. In the example, the entering vibration is not performed since the exiting vibration is performed at the exiting time as shown in the situation (3) of FIG. 6 and the entering to the second operation element is not performed as shown in the situation (4) of FIG. 5. However, the entering vibration is performed at the entering time to the second operation element even after the predetermined time lapses from the exiting time. After that, the actuations after the situation (1) of FIG. 5 and the situation (1) of FIG. 6 are repeated.

Figure 7:
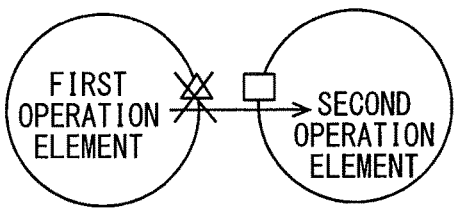
FIG. 7 is an explanatory view showing one example of the embodiments of the vibration control.
Figure 7:
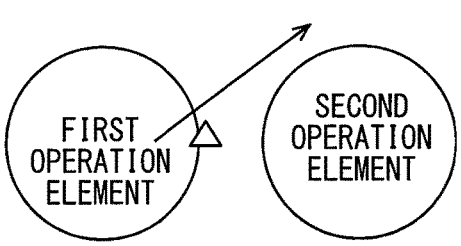
Figure 7:
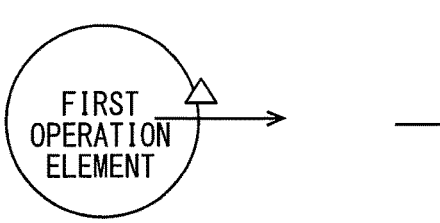
Figure 7:
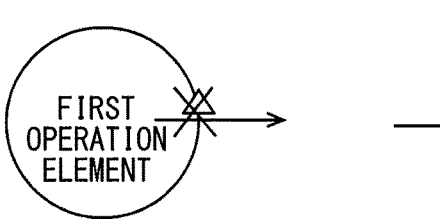

FIG. 7 is a typical example showing an effect of the vibration control of FIG. 4. An example 1 of FIG. 7 is an explanatory view showing one example of the embodiments of the control vibration in a case where the first operation element and the second operation element are nearly arranged. An example 2 of FIG. 7 is an explanatory view showing one example of the embodiments of the vibration control in a case where direction of the tracing operation deviates from the second operation element. An example 3 of FIG. 7 is an explanatory view showing one example of the embodiments of the vibration control in a case where the first operation element is arranged far from the second operation element and also a tracing operation speed is slow. An example 4 of FIG. 7 is an explanatory view showing one example of the embodiments of the vibration control in a case where the first operation element are arranged far from the second operation element and also the tracing operation speed is quick. As shown in the example 1 of FIG. 7, in the case where the first operation element and the second operation element are nearly arranged, the second operation element is reached within the predetermined time even when the tracing operation speed is quick or slow. Therefore, the entering vibration is performed without performing the exiting vibration. As shown in the example 2 of FIG. 7, in the case where the direction of the tracing operation deviates from the second operation element, the exiting vibration is performed and the entering operation is not performed even when the tracing operation speed is slow or quick.

As shown in the example 3 and the example 4 of FIG. 7, the content of the vibration control is different corresponding to the tracing operation speed in the case where the first operation element is arranged far from the second operation element. That is, in the case where the tracing operation speed is slow as the example 3, the second operation element is not reached within the predetermined time, so that the exiting vibration is performed, and thereafter the entering vibration is performed after the sufficient time lapses. In the case where the tracing operation speed is high as the example 4, the second operation element is reached within the predetermined time, so that the exiting vibration is not performed and the entering vibration is performed.

According to the embodiment, since the holding control part in S16 is provided, at when the touch position exits the first operation element, the exiting vibration is held and the vibration is not performed in a case where it is predicted that the second operation element is entered within the predetermined time. When the tracing operation is performed from the first operation element to the second operation element, for example, in a case where the user moves the fingertip F as exemplified in the example 4 of FIG. 7, it is predicted that the second operation element is entered within the predetermined time and the exiting vibration is held. The exiting vibration notifying the exiting from the first operation element and the entering vibration notifying the entering to the second operation element are avoided to be successively performed without intervals. Therefore, it may be possible to prevent a user from being unable to recognize the notification contents through the vibration.

Furthermore, according to the embodiment, the entering vibration control part in S20 is provided, and the entering vibration is performed regardless of the prediction result by the prediction part in S13 and S14 at when the touch position enters the second operation element. Not only when the speed of the fingertip F entering the second operation element is slow (refer to the example 3 in FIG. 7) but also when the speed of the fingertip F entering the second operation element is quick (refer to the example 4 in FIG. 7), the entering vibration is performed. According to the embodiment, it may be possible to improve the usability for the user moving the fingertip F quickly since the entering vibration is more useful than the exiting vibration for the user being used to moving the fingertip F quickly, as described above.

According to the embodiment, the vibration control part 22 has the exiting vibration control part in S15. The exiting vibration control part actuates the vibration instrument 14 at the exiting time that the touch position moves from the inside to the outside of the first operation element (exiting vibration) when the prediction result of the prediction part in S13, S14 denies the reaching. Therefore, since the exiting vibration is performed in the case of not having the possibility that the exiting vibration and the entering vibration are successively performed without intervals, it is not caused that the user is difficult to recognize the notification content. It may enable the user to recognize the exiting from the first operation element.

According to the embodiment, the additional prediction part in S17, S18 is included, and also the vibration control part 22 includes the holding release part in S19. When the touch position is outside the first operation element and the second operation element, the additional prediction part additionally predicts whether the touch position reaches the second operation element based on the movement trace until the present time after the predictions in S13, S14 are performed. The holding release part releases the holding control by the holding control part and actuates the vibration instrument 14 (exiting vibration) when the additional prediction by the additional prediction part denies the reaching.

In a case where the reaching is predicted at the time of exiting from the first operation element and the exiting vibration is held, when the direction or the speed of the tracing operation changes, the holding of the exiting vibration can be released corresponding to the change. For example, when a tracing operation direction deviates from the second operation element or a tracing speed becomes slow after the exiting time, the situation is changed to a situation that the second operation element becomes difficult to be reached within the predetermined time. Therefore, it is not caused that the user is difficult to recognize the notification content corresponding to the change of the situation. It may enable the user to recognize the exiting from the first operation element.

According to the embodiment, the vibration control part 22 continues the holding by the holding control part when the additional prediction by the additional prediction part affirms the reaching. Therefore, it may be possible to improve certainty for avoiding that the exiting vibration and the entering vibration are successively performed without intervals.

Second Embodiment

Figure 8:
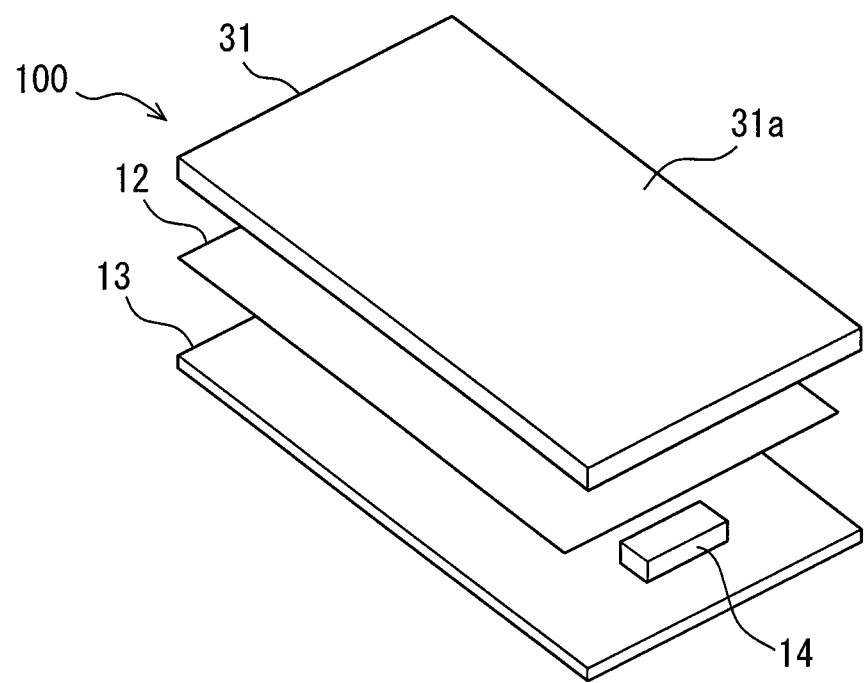
FIG. 8 is an exploded perspective view of the onboard operation apparatus according to a second embodiment of the present disclosure.

In the first embodiment, the input device 10 and the display device 30 are separately placed as shown in FIG. 1. By contrast, according to the embodiment, an input device 100 that the input device and the display device are integrated with display function (refer to FIG. 8) is replaced to the input device 10 and the display device 30, as shown in FIG. 8. That is, the onboard operation apparatus according to the embodiment includes the input device 100 with the display function and the control device 20. The input device 100 is placed at the similar position to the display device 30 shown in FIG. 1 in an instrumental panel.

The input device 100 has a display panel 31, the detection sheet 12 and the circuit board 13. The display panel 31 has a liquid crystal layer retaining a liquid crystal and an electrode layer applying voltage to the liquid crystal. The display panel 31 displays an image with using a back light (not shown) as light source. A display face of the display panel 31 functions as an operation face 31a touch-operated by the fingertip F of the user, and the display panel 31 corresponds to the operation panel. The detection sheet 12 is stuck to a rear face of the display panel 31 with adhesive. The display panel 31, the detection sheet 12 and the circuit board 13 are housed in the hosing (not shown), and the display panel 31, the detection sheet 12 and the circuit board 13 are retained.

In a state that the display panel 31, the detection sheet 12 and the circuit board 13 are combined, the vibration instrument 14 contacts the display panel 31. Therefore, the user touch-operating the operation face 31a feels the vibration of the vibration instrument 14. The vibration control by the control device 20 and the control content of the display control device or the like are similar to the vibration control of the first embodiment. In the embodiment, an effect similarly to the first embodiment is provided.

Other Embodiment

In the above, the embodiment of the present disclosure is explained. However, the present disclosure is not limited to the embodiment explained above and can be provided with variation exemplified as bellow. It may be possible to provide not only combination of parts clearly showing that the combination of the parts can be specifically provided in each embodiment but also combination of a part of each embodiment without clearly shown when obstacle of the combination does not especially occur.

In the first embodiment, the specific areas of the operation face 11a are set as the operation elements A1 to A6. However, size, shape, position, number or the like of the area may be changed corresponding to the display content in the display device 30 or the display panel 31.

According to the first embodiment, though the additional prediction part in S17, S18 is included, the additional prediction part may be abolished. In the case, since the prediction result at the time of exiting is unchanged, the holding is maintained until a next entering is detected when the exiting vibration at the time of exiting is hold. That is, the holding in the case means for prohibiting the exiting vibration.

In an explanation of the first embodiment, though the operation element A1 being one of the multiple operation elements A1 to A6 and positioned at the lower left is explained as the first operation element, another element may be set to the first operation element. In the explanation of the first embodiment, though the specific operation element A2 being one of the multiple operation elements A1 to A6 is explained as the second operation element, another element may be set to the second operation element.

According to the first embodiment, the electrostatic position sensor by the detection sheet 12 and the circuit board 13 is employed. By contrast, a resistance position sensor causing the electric resistance to vary corresponding to the touch position may be employed. Though the vibration instrument 14 with the electric motor and the vibrator is employed on the first embodiment, a vibration instrument with use of piezoelectric element may be employed.

Software stored in a tangible storage medium and a computer executing the software, only the software, only hardware, or combination of them may be possible to provide a method and/or function provided by the control device 20. For example, when the control device 20 is provided by an electronic circuit being hardware, it may be possible to provide by a digital circuit including multiple logic circuits or analog circuits.

It is noted that a flowchart or the processing of the flowchart in the present application includes multiple steps (also referred to as sections), each of which is represented, for instance, as S10. Further, each step can be divided into several sub-steps while several steps can be combined into a single step.

In the above, the embodiment, the configuration, an aspect of the onboard operation apparatus according to the present disclosure are exemplified. However, the present disclosure is not limited to every embodiment, every configuration and every aspect related to the present disclosure are exemplified. For example, the field of the embodiment, the configuration, the aspect relate to the present disclosure includes the embodiment, the configuration, the aspect obtained by accordingly combining each technical part disclosed in different embodiment, configuration and aspect.

What is claimed is:

1. An onboard operation apparatus comprising:
   an operation panel that is installed in a vehicle and has an operation face that is touch-operated by a fingertip of a user;
   an output part that outputs an operation signal corresponding to an operation element that is touch-operated, the operation element being one of a plurality of operation elements arranged on the operation face;
   a vibration instrument that vibrates the operation panel, causing the user performing a touch operation to feel vibration;
   a position sensor that detects a touch position by the fingertip on the operation face;
   a vibration control part that controls actuation of the vibration instrument corresponding to the touch position detected by the position sensor;
   a trace calculation part that calculates a movement trace of the touch position based on a detection history by the position sensor; and
   a prediction part that predicts based on the movement trace inside a first operation element of the plurality of operation elements, whether the touch position reaches a second operation element of the plurality of operation elements within a predetermined time, when the touch position moves from inside of the first operation element to outside of the first operation element,
   wherein:

the vibration control part has an entering vibration control part that actuates the vibration instrument regardless of a prediction result by the prediction part at when the touch position moves from outside of the second operation element to inside of the second operation element; and the vibration control part also has a holding control part that holds the actuation of the vibration instrument and causes the vibration instrument not to vibrate at when the touch position moves from the inside of the first operation element to the outside of the first operation element in a case where the prediction by the prediction part affirms a reaching.

2. The onboard operation apparatus according to claim 1, wherein:

the vibration control part has an exiting vibration control part that actuates the vibration instrument at when the touch position moves from the inside to the outside of the first operation element, in a case where the prediction by the prediction part denies the reaching.

3. The onboard operation apparatus according to claim 1, further comprising:

an additional prediction part that additionally predicts whether the touch position reaches the second operation element based on the movement trace from a time when the prediction is performed by the prediction part to a present time, in a case where the touch position is outside the first operation element and the second operation element, wherein:

the vibration control part has a holding release part that releases a hold by the holding control part and actuates the vibration instrument when an additional prediction by the additional prediction part denies the reaching.

4. The onboard operation apparatus according to claim 3, wherein:

the vibration control part continues the hold by the holding control part when the additional prediction by the additional prediction part affirms the reaching.

* * * * *